United States Patent [19]

Bobulski

[11] 4,024,469

[45] May 17, 1977

[54] APPARATUS FOR MEASURING SPARK PLUG GAP SPACING

[75] Inventor: Henry Alan Bobulski, Westerville, Ohio

[73] Assignee: Production Measurements Corporation, Natick, Mass.

[22] Filed: Mar. 24, 1975

[21] Appl. No.: 561,424

[52] U.S. Cl. ............................................ 324/16 R
[51] Int. Cl.² ...................................... G01R 13/42
[58] Field of Search ................. 324/15, 16 R, 16 T, 324/16 S

[56] References Cited

UNITED STATES PATENTS

| | | | |
|---|---|---|---|
| 2,430,069 | 11/1947 | Mesh | 324/16 S |
| 3,551,800 | 12/1970 | Widmer | 324/15 |
| 3,572,103 | 3/1971 | Marino | 324/16 R X |
| 3,603,872 | 9/1971 | Pelta | 324/16 R |
| 3,630,076 | 12/1971 | Staudt | 324/15 X |
| 3,740,642 | 6/1973 | Taylor | 324/16 R |
| 3,768,004 | 10/1973 | Abnett | 324/16 R |
| 3,771,047 | 11/1973 | Spengler et al. | 324/16 R |

*Primary Examiner*—Gerard R. Strecker
*Attorney, Agent, or Firm*—Edgar H. Kent

[57] ABSTRACT

This invention relates to testing spark plugs and, more particularly to measuring the gap spacing. An improved measuring apparatus is described that uses an AC high voltage applied across the spark plug electrodes and measures the time between a zero crossing of the AC high voltage and the plug firing. This measurement is averaged over several firings for a plug. Provision is made to burn off any debris in the plug gap before measurement begins. It has been discovered that an improved measurement output results from measuring only when positive half-cycles of the AC high voltage are applied to the plug center electrode with respect to the base electrode. The measurement output is linearized to obtain a linear output over a wide gap spacing. When a fault current is sensed, the measurement operation is stopped.

16 Claims, 7 Drawing Figures

APPARATUS FOR MEASURING SPARK PLUG GAP SPACING

BACKGROUND OF THE INVENTION

The present invention relates to the field of testing apparatus for vehicle engines and parts, and, more particularly, to measurement of spark plug gap spacing. The proper spark plug gap spacing is important to the operating of the engine. It is essential to have an accurate and convenient to operate measuring device.

A number of prior devices have been used. One in particular known to this inventor was an arrangement that incorporated the spark plug gap in the circuit of a relaxation oscillator. A DC voltage was applied across the spark plug electrodes. The gap spacing acted as a capacitor, determining the relaxation oscillator frequency. The frequency was measured and that calibrated with gap spacing. This approach had its advantages and worked for many applications. However, it did not reliably indicate gap spacing when the spark plug was in the engine and the measurement was made by connecting that test device to the engine ignition system through the distributor cap contacts. The high resistance and other, added circuit parameters prevented this type of device from operating satisfactorily.

The general approach used in the present invention is to apply an AC voltage across the spark plug gap. This approach is not new, as shown by the references listed below. Various devices have used an AC voltage or a voltage pulse. Some of these references illustrate the generally known voltage and current relation occuring when an AC voltage is applied across a spark plug, where the voltage increases until the plug fires, and then drops, and the current through a normal plug is zero until the plug fires. It is known that the voltage firing is a function of the spark plug gap spacing and it can be used to measure the gap spacing.

These and other features are shown in the references found in the preliminary novelty search conducted by applicant's attorney. All the references reported from this search are listed below:

U.S. Pat. No. 2118137, issued May 24, 1938
U.S. Pat. No. 2324458, issued July 13, 1943
U.S. Pat. No. 2430069, issued Nov. 4, 1947
U.S. Pat. No. 2649567, issued Aug. 18, 1953
U.S. Pat. No. 3035224, issued May 15, 1962
U.S. Pat. No. 3175149, issued Mar. 23, 1965
U.S. Pat. No. 3,551,800, issued Dec. 29, 1970
U.S. Pat. No. 3603872, issued Sept. 7, 1971
U.S. Pat. No. 3740642, issued June 19, 1973
IBM Technical Bulletin, Vol, 13, No. 10 (March 1971) Pages 3185 to 3188, "Method for Ignition System Testing Servicing Decisions", by L.S. Briney, et al.

SUMMARY OF THE INVENTION

A number of very important advantages are obtained from using the improved spark plug gap measuring apparatus of the present invention.

One of the advantages is the ability to measure gap spacing of plugs while they are in the engine, using the ignition wires through connection to the distributor cap terminals. The wire resistance and other parameters do not affect the gap measurement or the calibration of the apparatus, so that repeatable measurements can be obtained on plugs in different engines.

The invention can be used for measurement of spark plugs in engines in a factory, in or out of a vehicle, or plugs set up in special test racks.

Another advantage of the present invention is the measurement of more than one plug at one time. While only a one plug mesurement embodiment is shown, it can be duplicated for each plug for simultaneous measurement of each plug. In the alternative it can be connected to measure a group of plugs, each spark plug in turn.

In one embodiment the invention applies an AC high voltage across the spark plug gap. The time from zero-crossing of the high voltage to firing is measured. This time measurement is averaged for several firings of the spark plug, to obtain the gap spacing indication.

The present invention has recognized the need to let the spark plug fire several times to burn off debris from within the plug gap. Provision is made in the embodiment for this feature.

The present invention responds to a fault current, caused by shorted plug or other condition that makes gap measurement impossible. In the embodiment, current is sensed in the plug circuit before firing and causes the apparatus to terminate measurement of the plug.

It has been discovered that the gap measurement is improved over a wider range of gap spacings by measuring the firing times only when the center spark plug electrode has positive half cycles of the high voltge AC applied with respect to the spark plug base electrode.

The output of the averaged time from zero crossing to firing was found, when calibrated, to have two gap spacing ranges. One portion of the output corresponded to lower gap spacings and it was substantially linear. Another portion of the output corresponded to higher gap spacings and it was substantially linear with a different slope than the other portion. The present invention, in the disclosed embodiment processes the output and obtains a linear output with respect to gap spacing over both ranges.

These and other features of the present invention are illustrated by the described embodiment for the benefit of one skilled in the art to utilize any one or combinations of them to achieve an improved mesurement of spark plug gap.

BRIEF DESCRIPTION OF THE DRAWINGS

In FIG. 5 (b) the less desirable output is shown, when only negative half cycles were used on the plug center electrode with respect to the base electrode.

DESCRIPTION OF THE PREFERRED EMBODIMENT

Figure 1:
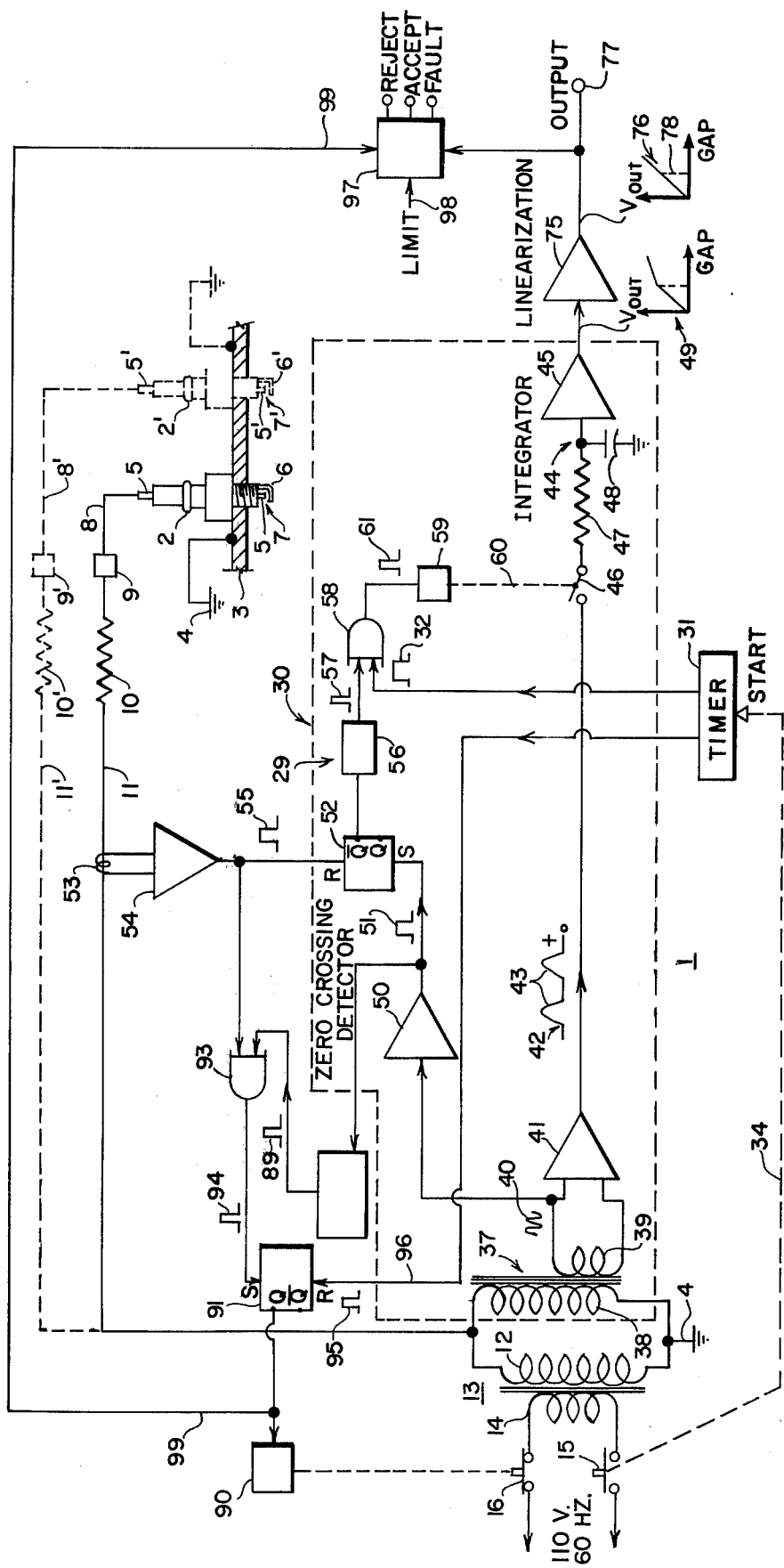
FIG. 1 is block diagram of one embodiment of spark plug gap measuring apparatus arranged in accordance with the present invention.

The measurement of spark plug gap spacing is performed by apparatus 1 (FIG. 1). The spark plug 2 is shown in an engine block 3 that is connected to the ground 4 of measuring apparatus 1. Plug 2 is the typical automotive type, with center electrode 5 and a base electrode that screws in engine block 3 and has the other electrode 6 connected electrically and mechanically to it. Apparatus 1 is designed to measure the gap spacing 7 that is a critical dimension in the performance of an engine.

Apparatus 1 is connected to plug 2 by an electrical conductor 8 through a connector 9. Wire 8 can be ignition system cable to plug 2 or a separable test cable. In the case where the ignition cable is used, connector 9 can include the distributor cap and a mating plug. A resistor 10 is in the line 11 before connector 9, to limit current flow and line 11 is connected to the source of high voltage, to be described later.

Apparatus 1 can be used to measure more than one spark plug, with duplicaton of some parts, and this expansion potential is illustrated in FIG. 1 by parts in dash lines and with the same reference numbers having a prime mark added.

The source of AC high voltage is the secondary 12 of transformer 13 producing approximately 4,000 volts AC. A 60 cycle, 110 volt AC voltage is applied to the primary winding 14 through an operating switch 15. Operating switch 15 is normally open and when it is pushed closed it remains closed and voltage is applied. The primary circuit also includes fault responsive switch 16 that is normally closed and it will be described further on under the heading FAULT DETECTION. One end of secondary 12 is connected to line 11 and the other end is connected to ground 4. The connection of ground 4 to engine block 3 is by a clamp (not shown) that can be removed easily.

The AC high voltage from secondary 12 is of a sufficiently large amptitude to cause spark plug gap 7 to breakdown, generally called firing the plug. The voltage across plug 2 is shown by curve 17 in FIG. 2 (a). The voltage starts from a zero point 19, called the zero crossing and increases in positive (up) direction following the sinusoidal voltage until the plug is fired, at point 18. The voltage drops, levels off and then further decreases with the sinusoided voltage to another zero point 19', to complete the positive half-cycle. The negative half-cycle causes the plug to fire and follow the same pattern until the cycle is completed at point 20. It can be seen that plug 2 fires before the AC high voltage reaches its maximum positive and negative values, as indicated by dash line 21 and 22, respectively.

Figure 2:
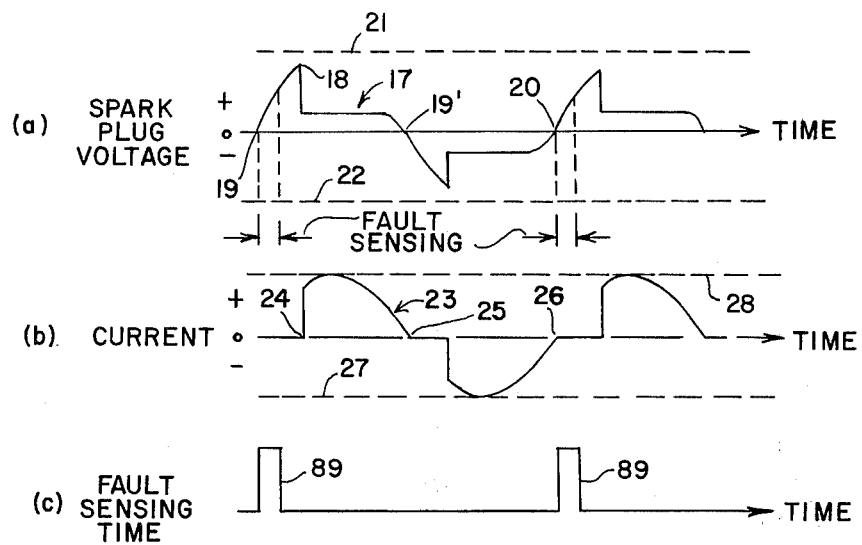
FIG. 2 shows voltage and current curves for a spark plug having an AC high voltage applied and helps to illustrate the fault sensing feature of the present invention for the apparatus of FIG. 1.

The current in line 11 and through the spark plug is shown in relation to AC high voltage 17 by curve 23, in FIG. 2 (b). Initially, there should be no current because plug 2 is an open circuit and has not fired and current curve 23 shows zero current. The case where a current is flowing before firing will be dealt with under the heading FAULT DETECTION below. At the firing voltage 18, current flows rapidly, starting at point 24, and then increases with the voltage to a maximum value and decreases to zero at point 25 at the end of the positive half cycle. The current is zero until the next firing, on the negative half-cycle, and follows the same curve as the first half-cycle up to the end of the cycle at point 26. The maximum current flow is shown by dash lines 27 for the negative current and 28 for the positive current.

The operation of apparatus 1 will be described now with respect to several operational features and related sub-systems identified by appropriate headings.

SPARK GAP SPACING MEASUREMENT — GENERAL

The spark gap spacing measurement sub-system 29 enclosed generally by dash line 30 performs the function of measuring the firing time over several cycles and averages these measurements to obtain a reliable indication of spark plug gap spacing 7. Several independently significant improvements are used.

BURN-OFF OPERATION

Figure 3:
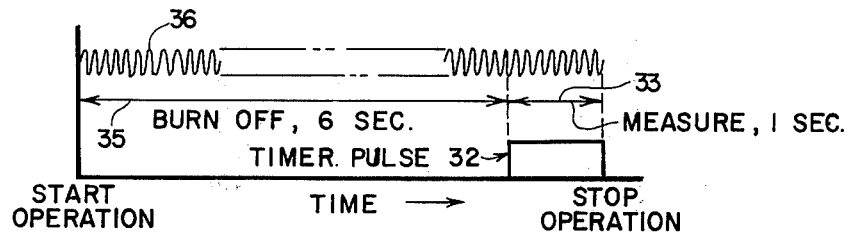
FIG. 3 is a graphical representation of the apparatus operation, showing the burn-off time before gap measurement begins, for the apparatus of FIG. 1.

One improvement eliminates the effect of debris by providing a burn-out time during which the plug is fired and no gap measurement is made. This improvement eliminates problems such as caused by plugs that have not been used before and may have packing carton paper in between the plug electrodes. When switch 15 is closed, starting the operation of apparatus 1, a timer pulse generator 31 is started, as indicated by dash line 34, producing a pulse 32 that activates operation of the spark gap measurement sub-system 29, after an initial, burn-off time period 35 (FIG. 3) of approximately 6 seconds. The measurement time period 33 (FIG. 3) is approximately 1 second. Many firings of plug 2 occur during burn-off period 35, as shown by the AC high voltage cycles 36 during that period and the debris is removed by these discharges, stablizing the firing discharge. No measurements are taken during this time period. If measurements were taken during the burn-off period, some inaccurate measurements could occur. During the measurement period 33, many plug firings are measured. The measurement operation stops at the end of measurement period 33, when timer pulse 32 terminates.

FIRING TIME MEASUREMENT

Spark plug gap sub-system 29 averages the time between zero voltage crossing of the AC high voltage to the firing time, as a measure of the spark plug gap spacing, and this measurement is calibrated with the plug gap spacing and indicated by a suitable output device such as a meter. The repeated measurement of this period, called the firing time, and the averaging of these measurements is an accurate way to obtain consistent results for spark plugs in different engines or with various ignition system circuit parameters involved.

An AC voltage that follows the AC high voltage from transformer secondary 12 is coupled to gap measurement sub-system 29 by transformer 37 having its primary 38 coupled across secondary 12 of transformer 13. Transformer 37 is a step-down transformer and provides at its secondary 39 an AC voltage 40 of about 5 volts. Voltage 40 is coupled to the input of an AC amplifier unit 41 that is shown in detail in FIG. 6 and will be described hereinafter.

Figure 4:
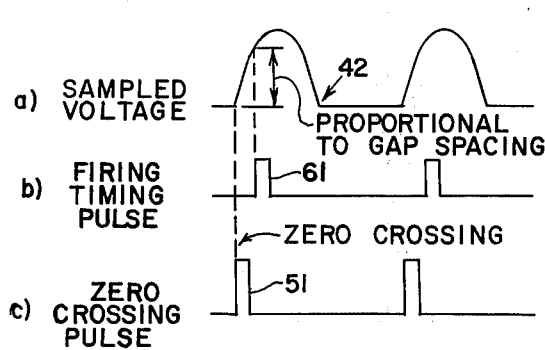
FIG. 4 shows the sampled voltage and the relate timing pulses that are used to measure the plug firing time in the apparatus of FIG. 1.

The function of amplifier unit 41 is to produce an output that is shown by wave form 42, that consists only of the positive half cycles 43 of voltage 40. The negative half cycles are eliminated, the voltage being zero at that time. FIG. 4 shows waveform 42 and it will be used to explain the operation of gap measuring subsystem 29. The output of amplifier unit 41 is coupled to an integrator 44 and DC amplifier 45, through normally open switch 46. Integrator 44 includes series resistor 47 and capacitor 48. Voltage across capacitor 48 is the integrator output and is coupled to the input of amplifier 45. The output of amplifier 45 is shown by graph 49 and in a larger view in FIG. 5 (a).

Figure 6:
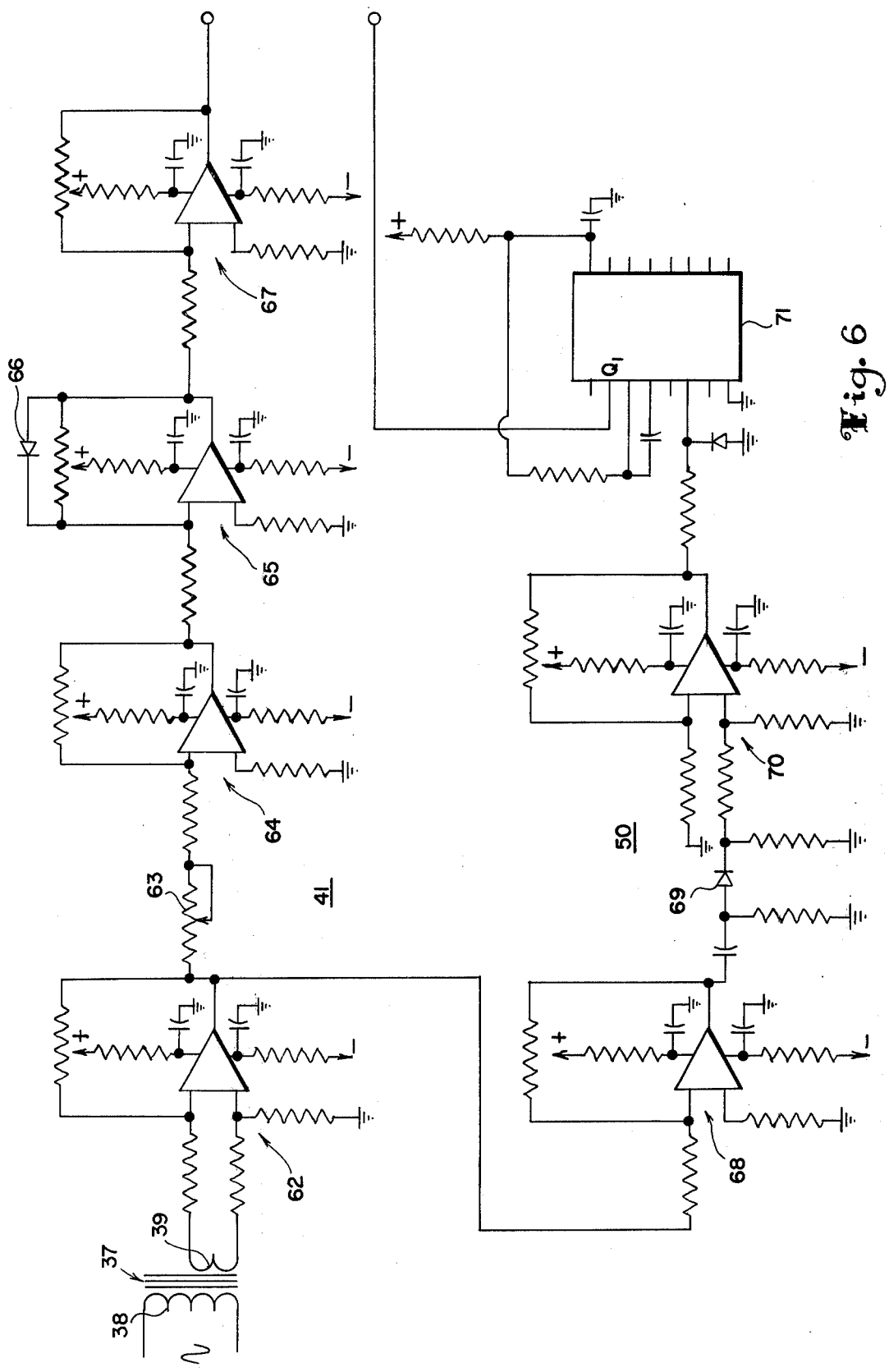
FIG. 6 is the diagram for one embodiment of a circuit for producing the sampled voltage and for producing the zero crossing signal for the apparatus of FIG. 1.

The output of transformer 37 is also coupled to a zero crossing detector unit 50. The circuit for zero crossing detector unit 50 is shown in FIG. 6 and it will be described hereinafter. The function of zero crossing detector unit 50 is to produce pulse 51 that has its leading edge beginning at the time voltage 40 crosses zero, the same time the positive high voltage on spark plug 2 crosses zero. Pulse 51 drives the set input of flip-flop 52. There is no output coupled from flip-flop 52 in response to pulse 51, but it initiates the timing operation at zero crossing, as shown in FIG. 4 (a) and (c). The firing time is determined by a current sensing device 53, illustrated as a sensor coil, or it can be light emitting diodes coupled to a photo sensitive transitor. The output of sensing device 53 is coupled to amplifier 54 that produces a pulse 55 that drives the reset input of flip-flop 52. As soon as pulse 55 is received, flip-flop 52 is reset and an output is coupled to a monostable multivibrator 56 that produces a pluse 57 coupled to one input of AND gate 58. The other input of AND gate 58 is pulse 32 from timer 31. The output 61 of AND GATE 58 is coupled to a switch control device 59 that activiates switch 46, as represented by dash line 60.

The operation of spark gap measuring sub-system 29 can be seen readily with reference to FIG. 4. Each zero crossing pulse 51 sets flip-flop 52 at zero voltage, as the high voltage firing voltage goes positive. When the plug fires, current is sensed by sensor 53, and pulse 55 resets flip-flop 52 and initiates monostable multivibrator pulse 57. During the burn-off period 35 (FIG. 3) AND gate 58 produces no output; timer 31 has not produced pulse 32. The absence of pulse 32 effectively inhibits operation of the gap measuring sub-system 29. When pulse 32 is present AND gate 58 produces pulse 61 that activates switch control 59 and closes switch 46. Switch 46 couples the output of amplifier unit 41 to integrator 44, and a voltage is sampled when the plug fires. Switch 46 opens rapidly and stays open until another pulse 61 is received. This operation repeats for each positive half cycle. In each operation of switch 46, the voltage sampled is proportional to the plug firing time and proportional to the plug gap spacing. The average of these firing time measurements is obtained from integrator 44 and at the output of amplifier 45 a voltage proportional to the plug gap spacing is produced.

A circuit diagram for amplifier unit 41 and zero crossing detector 50 is shown in FIG. 6. Amplifier unit 41 receives AC voltage 40 from transformer 37 at the input terminals of a differential amplifier 62. The gain of amplifier unit 41 is controlled by potentiometer 63 in the input of amplifier 64, coupled to the output of amplifier 62. Amplifier 62 is coupled to the polarity selection amplifier 65 that includes a diode 66 in its feedback loop. Diode 66 is arranged to short out the positive going half-cycles and causes amplifier 65 to select only the negative going half-cycles. This output is coupled to buffer amplifier 67 that produces the positive half-cycles show by waveform 42 in FIG. 4. The output of buffer amplifier 67 is the output of amplifier unit 41. The circuits of amplifier unit 41 are conventional and the detail operation is apparent to one skilled in the art.

The zero crossing detector 50 is also shown in FIG. 6 and has its input coupled to the output of differential amplifier 62 of amplifier unit 41. This input drives a high gain amplifier 68 that produces essentially square waves in its output. The positive leading edge of the output of amplifier 68 is differentiated in the output circuit and only a positive edge pluse is passed on through diode 69 to amplifier 70, to drive an integrated circuit 71 arranged to function as a monostable multivibrator, to produce a positive pulse at zero crossing. The circuit of zero crossing detector 50 are conventional and the detailed operation is apparent to one skilled in the art.

SPARK GAP SPACING MEASUREMENT — POSITIVE VOLTAGE HALF CYCLES

Figure 5:
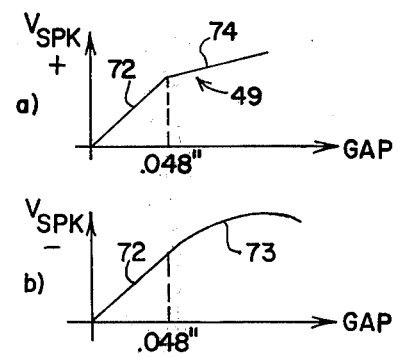
FIG. 5 are graphical presentations of the measuring device output for the apparatus of FIG. 1, before linearization, showing in FIG. 5 (a) the improved gap range response result obtained with measuring only during positive high voltage half cycles applied to the plug center electrode with respect to the base electrode.

It has been discovered that the accuracy of the spark plug gap measuring sub-system 29 changes with the polarity of voltage applied to the spark plug during measurement. FIG. 5 illustrates the effect discovered. In FIG. 5 (b) the firing time measurements were taken only when negative voltage was applied to the plug, electrode 5, with respect to base electrode 6. The result was a linear increase, as shown by straight line Section 72, from small gap spacings up to 0.048 inch spacing. The spark plug voltage used to fire the plug took a non-uniform shape, as shown by rounded curve Section 73, for gap spacings larger than 0.048 inches.

When only positive half cycles were applied to center electrode 5, the curve shown in FIG. 5 (a) was obtained. The linear portion 72 was retained for gap spacing up to 0.048 inches, but the portion above 0.048 inches was now linear, with a different slope from portion 72, as shown by straight line section 74. The change in slope was at the 0.048 inch gap spacing.

This discovery emphasized the importance of using only the positive half cycles when measuring gap spacing. The gap spacing measurement subsystem 29 utilizes this advantage and other gap measuring systems can incorporate it. An increased range of gap spacing can be measured more accurately. Also, the sensitivity to gap changes is greater.

OUTPUT — LINEARIZATION

There is additional benefit gained from the use of only positive voltage half cycles on the plug center electrode when measuring gap spacing. The output voltage, represented by waveform 49, can be converted into a linear output over the entire gap spacing range by linearizing amplifier unit 75. The output of linearizing amplifier 75 is shown in graph 76, adjacent output terminal 77, with a straight line relation with gap spacing over the full range, above and below the 0.048 inch point, represented by the dash line 78.

The function of linearizing amplifier unit 75 is to take the voltages corresponding to the smaller gap range, line 72 of FIG. 5 (a) and amplify them separately. The voltages representing the larger gap spacings, line 74, are amplified separately. The gains of these amplifiers are set so that the resultant output curve, after the amplified signals are combined, is substantially linear across the entire range as shown in graph 76 (FIG. 1).

Figure 7:
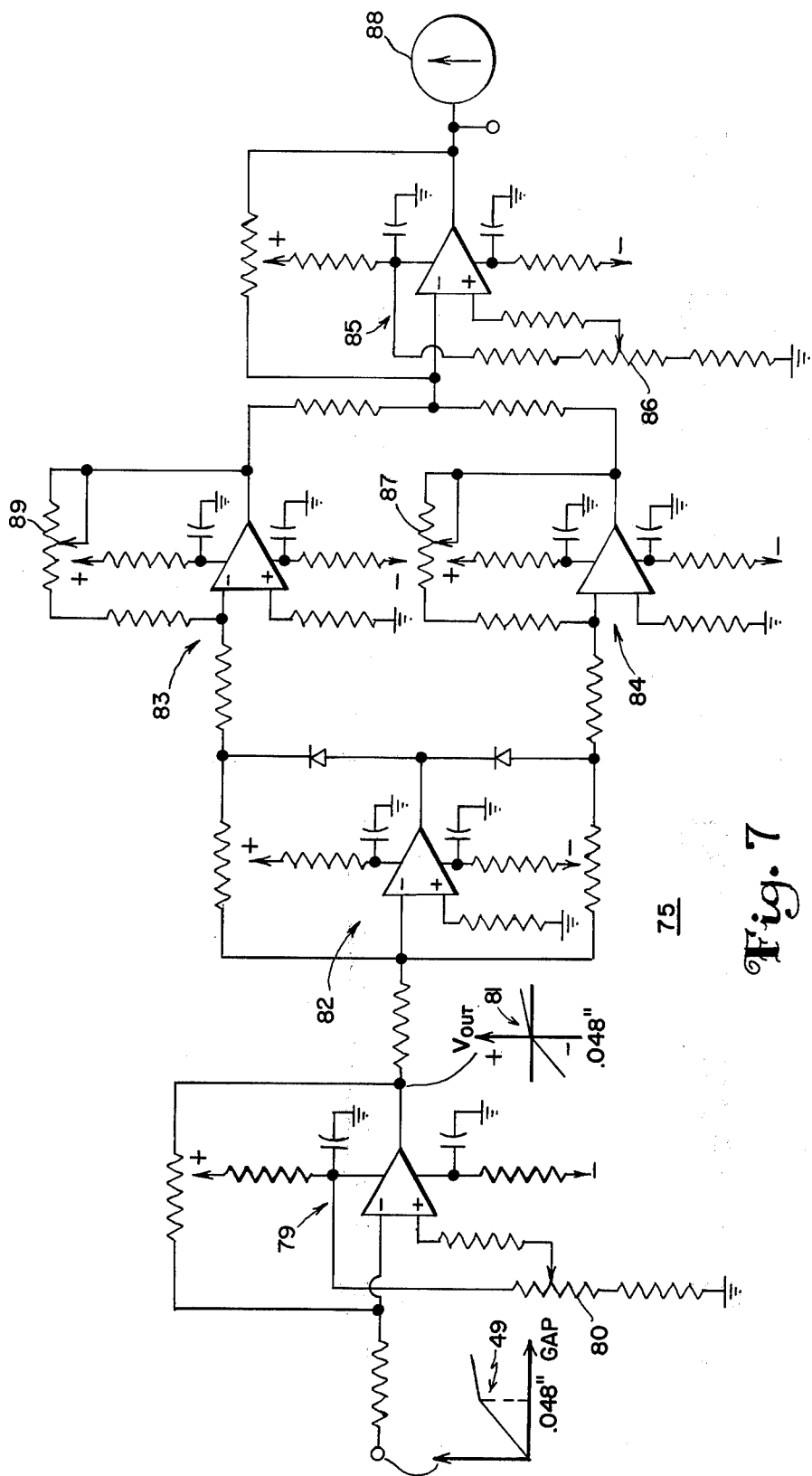
FIG. 7 is one embodiment of a circuit for linearization of the integrated firing time measurements obtained in the apparatus of FIG. 1, in accordance with the present invention.

A circuit embodiment for accomplishing the function of linearizing unit 75 is shown in FIG. 7. The output of amplifier 45 is coupled to the input of amplifier 79. The input potentiometer 80 is adjusted so the output of amplifier 79 is zero when a plug with 0.048 inch spacing is being measured. The output is shown in graph 81. A polarity separation amplifier 82 couples the measured voltages above zero to amplifier 83 and those below zero to amplifier 84. The outputs of amplifiers 83 and 84 are combined at the input to output amplifier 85. With the 0.048 inch gap plug being measured, potentiometer 86 in the input of amplifier 85 is adjusted until the linearly calibrated output meter 88 reads 0.048 inches. A plug with a smaller gap, say 0.035 is measured. The gain control, potentiometer 87 in amplifier 84 is adjusted until the output meter reads 0.035 inches. Next, a plug with a gap larger than 0.048 inches is measured and potentiometer 89 in amplifier 83 is adjusted to make output meter read the proper gap spacing. The linearizing amplifier is now set up to indicate the gap spacing on a linear scale across the entire gap range. The circuits used in linearizing amplifier 75 are conventional and the detail operation are apparent to one skilled in the art.

Another output device 97 is coupled to output 77, to give a convenient operator display of the plug condition. An output indication is given, such as by an on reject light, when the plug is not within a range of acceptable spacing, as set by limit range input 98. An accept light goes on if the gap is within the limit range. A fault light goes on when a signal on line 99 is received, caused by a fault being sensed. The arrangement of output device 97 can take several forms, all of which are apparent to one skilled in the art.

FAULT SENSING

The presence of a shorted spark plug or other current flow immediately upon applying voltage to the plug should be detected promptly and the measuring operation stopped. The present invention incorporates such a feature. After zero crossing, a very short fault sensing period is established by pulse 89, FIG. 2 (c). Just as the high voltage increases from zero, if there is a current, it is sensed and produces a control signal that operates switch control 90 that opens switch 16 and holds it open, to de-activate the measuring operation.

The signal that operates switch control 90 is obtained from flip-flop 91 through output Q. Each zero crossing pulse from zero crossing detector 50 triggers a monostable multivibrator 92 that produces pulse 89, initiated at zero crossing for a duration much shorter than the time for a normal plug gap spacing to fire. In this way only fault current, not firing current, is sensed. Pulse 89 permits passage of a pulse 94 initiated by sensed current pulse 55 from AND gate 93 to set flip-flop 91.

When set, flip-flop 91 produces an output at Q that operates switch control 90 in the manner described. The fault sensing occurs at commencement of each positive half-cycle across the plug, since zero crossing detector 50 produces its pulse at the beginning of each positive half-cycle and pulse 89 is generated. At the commencement of a new measurement operation, when switch 15 is closed, timer 31 provides a reset pulse 95 on line 96 to flip-flop 91 and switch 16 is closed.

ALTERNATIVE EMBODIMENTS

The present invention has several important features that can be used together or separately. The circuit arrangements can take many forms for systems using one or more of these features, without departing from the inventive teaching. It is understood that the scope of the protected invention is to be determined by reference to the appended claims.

What is claimed is:

1. Apparatus for measuring a spark plug gap spacing, comprising a source of AC high voltage,
    means for applying said high voltage across a spark plug,
    means for measuring the time between zero crossing of said high voltage and the firing of the spark plug, and for averaging said time for several firings during half-cycles of said high voltage for the same spark plug,
    means for indicating said averaged, measured time as a function of the spark plug gap spacing.

2. Apparatus, as described in claim 1, wherein said averaging means includes means to inhibit said averaging means from responding to several initial firings of the spark plug, to let said high voltage burn off any debris in the spark plug gap before the averaging starts.

3. Apparatus, as described in claim 1, wherein said averaging means only averages the time measurements for the positive half cycles of said high voltage, one terminal of said high voltage source being arranged for connection to the base electrode of the spark plug and the other terminal being arranged for connection to the spark plug center electrode, said averaging means only averaging when the center electrode terminal is positive with respect to the base electrode from zero crossover to firing.

4. Apparatus, as described in claim 1, wherein said measuring means produces a measured voltage whose amplitude is a function of the time between said high voltage zero-crossing and the firing,
    said measured voltage having a substantially linear change with respect to gap spacing over one range of spark plug spacings and a different, substantially linear change with respect to gap spacing over another range for greater spark plug spacings,
    said measured voltages for successive cycles being averaged for a spark plug by said averaging means,
    said indicating means separately amplifying the averaged measured voltage for said one and said another ranges of spark plug spacings and combining said amplified measured voltages to provide a continuous, linear relation with spark plug spacing over both said one and another spacing ranges.

5. Apparatus, as described in claim 1, wherein said means for applying said high voltage comprises means for sensing the presence of any fault current flow from said high voltage source immediately after the high voltage zero-crossing and before firing of the spark plug, and in response to the flow of fault current, terminating measurement of the spark plug.

6. Apparatus, as described in claim 1, wherein said measuring means comprises
    means responsive to said high voltage for generating a first signal when said voltage crosses zero value, means responsive to current flow across the spark plug gap to generate a second signal at the time the current begins to flow at the time of firing, means for producing a third signal that follows said high voltage, passing through zero at the same time and changing in substantially the same relation from said zero to maximum values for several half-cycles, means responsive to said first and second signals for sampling said third signal,
said sampling occurring only after generation of said first signal and at the time said second signal is generated, said sampled signal magnitude being a function of the time between said zero crossing and firing of the spark plug and proportional to the spark plug gap spacing, said measuring means averaging said sampled signal to produce a fourth signal that is a function of the average of said sampled signal for several firings of the spark plug, said indicating means being responsive to said fourth signal to indicate the spark plug gap spacing.

7. Apparatus, as described in claim 6, wherein the spark plug has a base electrode that connects with the engine block, said high voltage is positive at the spark plug center electrode each time said third voltage is sampled, to improve the linear relation of said fourth signal with spark plug gap spacing.

8. Apparatus, as described in claim 6, wherein said indicating means comprises a first means responsive to said fourth signal to polarity separate the portion of said fourth signal corresponding to a lower range of spark plug gap spacings and comprising first amplifier means for separately amplify said lower range portion, said first means separating the portion of said fourth signal corresponding to a higher range of spark plug gap spacings and comprising second amplifier means to separately amplify said higher range portion, said fourth signal lower portion range and higher portion range being substantial linear with respect to spark plug gap spacing with different slopes, the change in slope occurring at the upper end of said lower range and the lower end of said higher range, said indicating means having second means for combining said amplified lower and higher fourth signal portions to produce a fifth signal that is a substantially linear function with respect to spark plug gap spacing over both said lower and upper gap spacing ranges.

9. Apparatus, as described in claim 6, wherein said apparatus comprises
means for inhibiting response to the initial firings of the spark plug, over several cycles, for a time that permits burn off of any debris between the spark plug gap, and after the burn off period said apparatus operating to indicate the spark plug spacing.

10. Apparatus, as described in claim 9, wherein, said inhibiting means comprises
means for initiating operation of said apparatus,
means responsive to said initiating means to produce a timing signal for a duration corresponding to said burn-off time,
means responsive to said timing signal for preventing operation of said sampling means until said burn-off time ends.

11. Apparatus, as described in claim 6, wherein said apparatus comprises
means for sensing a fault current flow immediately after application of said high voltage to the spark plug and before the spark plug normal firing, and terminating measurement of the spark plug when said fault current is detected.

12. Apparatus, as described in claim 11, wherein said fault sensing means comprises,
means for sensing a fault current flow from said high voltage source and producing a fifth signal when the current flows,
means responsive to said first signal for initiating a sixth signal with duration starting at said zero-crossing and continuing for a period less that the time required to fire the spark plug for each cycle of said high voltage,
means responsive to said fifth and sixth signals for producing a seventh signal only when said fifth and sixth signals occur at the same time, so that a fault current flow will initiate said seventh signal only from the zero crossing to the end of said fifth signal for each cycle of said high voltage, the normal spark plug firing not initiating said seventh signal, and
means responsive to said seventh signal to terminate operation of said apparatus.

13. Apparatus for measuring a spark plug gap spacing, comprising
a source of AC high voltage,
means for applying said high voltage across a spark plug,
means for measuring the time between zero crossing of said high voltage and the firing of the spark plug, and
means for indicating said time measurement as a function of the spark plug gap spacing,
said measuring means including means to inhibit said measurement from responding to several initial firings of the spark plug, to let said high voltage burn-off any debris in the spark plug gap before said time is measured.

14. Apparatus for measuring a spark plug gap spacing comprising
a source of AC high voltage,
means for applying said high voltage across a spark plug,
means for measuring the time between zero crossing of said high voltage and the firing of the spark plug,
means for indicating said time measurement as a function of the spark plug gap spacing,
said measuring occurring only during the positive half cycles of said high voltage, one terminal of said high voltage source being arranged for connection to the base electrode of the spark plug and the other terminal being arranged for connection to the spark plug center electrode, said measuring occurring only when the center electrode is positive with respect to the base electrode from zero crossing to firing.

15. Apparatus for measuring a spark plug gap spacing, comprisng a source of AC high voltage,
means for applying said high voltage across a spark plug,
means for measuring the time between zero crossing of said high voltage and the firing of the spark plug,
said measuring means comprising
means responsive to said high voltage for generating a first signal when said high voltage crosses zero value,
means responsive to current flow across the spark plug gap for generating a second signal at the time the current begins to flow across the gap at the time of firing, means for producing a third signal that has a predetermined reference value at the same time as said high voltage passes through zero and continually increases as said high voltage increases from zero to its maximum value in a half cycle, means responsive to said second signal for sampling said third signal, said sampling occurring only after generation of said first signal and at the time said second signal is generated, the magnitude of said sampled signal being a function of the time between said zero crossing of said high voltage and the firing of the spark plug and proportional to the spark plug gap spacing, and indicating means responsive to said sampled signal for indicating the spark plug gap spacing.

16. Apparatus for measuring a spark plug gap spacing, comprising a source of AC high voltage, means for applying said high voltage across a spark plug, means for measuring the time between zero crossing of said high voltage and the firing of the spark plug, means for indicating said time measurement as a function of the spark plug gap spacing, said indication means producing a measured voltage whose amplitude is a function of the time between said high voltage zero crossing and the firing, said measured voltage having a substantially linear change with respect to gap spacing over one range of spark plug spacings and a different, substantially linear change with respect to gap spacing over another range for greater spark plug spacings, said indicating means separately amplifying the measured voltages for said one and said another ranges of spark plug spacings and combining said amplified measured voltages to provide a continuous, linear relation with spark plug spacing over both said one and another spacing ranges.

* * * * *